United States Patent
Folmsbee (12)

(10) Patent No.: US 6,366,160 B1
(45) Date of Patent: Apr. 2, 2002

(54) WAVESHAPER FOR FALSE EDGE REJECTION OF AN INPUT SIGNAL

(75) Inventor: Alan C. Folmsbee, Santa Clara, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 08/667,891

(22) Filed: Jun. 20, 1996

Related U.S. Application Data

(63) Continuation of application No. 08/419,842, filed on Apr. 11, 1995, now abandoned, which is a continuation of application No. 08/028,849, filed on Mar. 10, 1993, now abandoned.

(51) Int. Cl.[7] ................................................ H03K 5/00
(52) U.S. Cl. .......................... 327/551; 327/552; 327/34; 327/278
(58) Field of Search ................................. 307/572, 520, 307/521, 592, 603, 597, 234; 328/167, 111, 112; 302/542, 601, 602, 542.1; 327/34, 36, 311, 263, 551, 552, 261, 262, 278, 310, 170, 393, 394, 395, 392

(56) References Cited

U.S. PATENT DOCUMENTS

| 4,730,131 A | * | 3/1988 | Sauer ........................... 307/520 |
| 4,797,585 A | * | 1/1989 | Segawa et al. ............. 307/602 |
| 4,894,791 A | * | 1/1990 | Jiang et al. .................. 327/226 |
| 5,028,824 A | * | 7/1991 | Young ......................... 327/262 |
| 5,113,098 A | * | 5/1992 | Teymouri .................... 302/520 |
| 5,497,263 A | * | 3/1996 | Masuda et al. ............. 327/395 |
| 5,530,400 A | * | 6/1996 | Hoang ......................... 327/395 |

FOREIGN PATENT DOCUMENTS

| JP | 3127508 | * | 5/1991 | ................. 327/226 |
| JP | 5175799 | * | 7/1993 | ................. 327/552 |

* cited by examiner

Primary Examiner—Dinh T. Le
(74) Attorney, Agent, or Firm—Sawyer Law Group LLP

(57) ABSTRACT

A circuit is utilized to reject false edges from a digital input signal to be provided to a digital circuit from a transmission line. The circuit includes circuitry for sensing the rising and falling edges of the signal and programmably filtering those edges such that the proper signal is transmitted to the digital circuit. The circuit also can be utilized at a plurality of power supply voltage ranges to remove such false edges without appreciably affecting the performance thereof.

8 Claims, 3 Drawing Sheets

WAVESHAPER FOR FALSE EDGE REJECTION OF AN INPUT SIGNAL

This application is a continuation of application Ser. No. 08/419,842 filed on Apr. 11, 1995 now abandoned which is a continuation application of the application Ser. No. 08/028,849 filed Mar. 10, 1993 now abandoned.

FIELD OF THE INVENTION

The present invention relates to digital integrated circuits and more particularly, the present invention relates to an apparatus for minimizing false edges at the input thereof.

BACKGROUND OF THE INVENTION

Integrated circuits oftentimes receive digital signals from transmission lines. It is known that even though the ideal input signal is a rectangular signal which has straight edges it is known that transmission line signals are noisy. This noise creates complicated shapes of the signal on the transmission line such that there are reflections thereon. Many of these types of transmission signals are so complicated and noisy that glitches can be received at the integrated circuit input. These noisy signals produce false edges which can cause improper circuit operation.

As is generally well known, in order to provide smaller and faster devices in CMOS process technology circuits CMOS devices have been designed which have a reduced scaling or a shrinking of the geometries thereof. For example, the gate length of the devices, which have been around 1.6 microns, are further reduced to under 1 micron so as to achieve higher speeds of operation. In particular, when the effective length of the gate decreases the gate delay will be reduced so as to yield faster devices. However, the shrinking of the sizes of the integrated semiconductor devices to a smaller size has not been accomplished without any resulting problems. Such semiconductor devices of reduced dimensions fail generally from being more noise sensitive (i.e., lower noise immunity) and being not capable of providing reliable data transfer.

One application where noise immunity and reliable data transfer becomes important is in the field of data transmission on a fully loaded Small Computer System Interface (SCSI) bus line which is coupled from a transmission line for communication with small computers. The basic problem encountered when transferring data on the SCSI bus line is due to noise and glitches which may cause double strobing of the data. The glitches are more hazardous when they appear on the request (REQB) and acknowledge (ACKB) lines.

The control signals REQB and ACKB are used to perform a "handshake" so as to transfer the data back and forth between a target (i.e., disc drive) and an initiator (i.e., host computer). A glitch occurring in the control signal REQB can cause one or more extra bytes to be counted during long data transfers at the transfer rate of between 1.0–10 Mbytes/sec. On the other hand, the incorrect or wrong data could be transferred such as when an early control signal REQB occurs and the data signal lines are still being settled, thus causing the wrong data to be sampled. In another situation, the glitch present in the control signal REQB when the SCSI phase lines are being switched could result in a wrong phase.

Hence, it is important to develop means to filter out the noise associated with such a signal. There have been previous circuits designed to filter out such noises. However, one of the problems with such circuits is that oftentimes when several glitches or false edges are produced by the transmission line then these false edges can add up to provide a false signal. Therefore, there can be an accumulation of false signals. This accumulation would then appear as one signal which in turn can be viewed as a true edge. Hence, it is important to reduce the chances that a particular series of glitches will look like one true signal.

In addition, if there are a plurality of power supply voltage levels being provided for example, one supply may be 5 volts and a second supply may be 3.3 volts, the rise and fall times of the internal signals associated with prior art devices would be different, thereby causing the filtering to be different. Hence, it is necessary to provide a means to allow for the proper delay times associated with multiple voltage supply levels. One way of addressing the difference in delay for multiple voltages is to change the capacitance sizes on the nodes of the circuit to make them different for one voltage range compared to another. However, by adding capacitors this would increase the size of an integrated circuit and there is a better way to adjust the delay.

Accordingly, what is needed is a circuit to address the above-mentioned problems. More particularly, what is necessary is a circuit that will allow for the rejection of false edges from a transmission line or the like. In addition, the circuit should be one which can be utilized for multiple power supply voltage ranges. Finally, what is needed is a circuit which can operate in a way that if there are multiple false edges in a particular transmission line signal those false edges will not accumulate and appear as a single true edge. The present invention addresses the above described problems.

SUMMARY OF THE INVENTION

An apparatus for removing false edges from an input signal comprising: means for receiving the input signal; means coupled to the receiving means for sensing rising and falling edges of the signal; means coupled for passing a rising edge if a first predetermined time period is exceeded before a next falling edge is sensed, passing a falling edge if a second predetermined time period is exceeded before a next rising edge is sensed; the first predetermined time period being longer than the second predetermined time period.

In one aspect of the present invention, the passing means is programmable so as to account for different power supply voltage levels.

In another aspect of the present invention, the apparatus further includes means for reinitializing the voltage therewithin to ensure there is no accumulation of glitches at the output thereof.

Through the use of the present invention false edges are programmably rejected depending upon input from control circuitry. In addition, the present invention allows for false edges to be similarly removed from input signals when the chip uses different power supply voltage levels.

DETAILED DESCRIPTION OF THE INVENTION

The present invention relates to a circuit for rejecting false edges or glitches on a transmission line. The following description is presented to enable one of ordinary skill in the art to make and use the invention and is provided in the context of a patent application and its requirements. Various modifications to the preferred embodiment will be readily apparent to those skilled in the art and the generic principles defined herein may be applied to other embodiments. Thus, the present invention is not intended to be limited to the embodiments shown but is to be accorded the widest scope consistent with the principles of features described herein.

Figure 1:
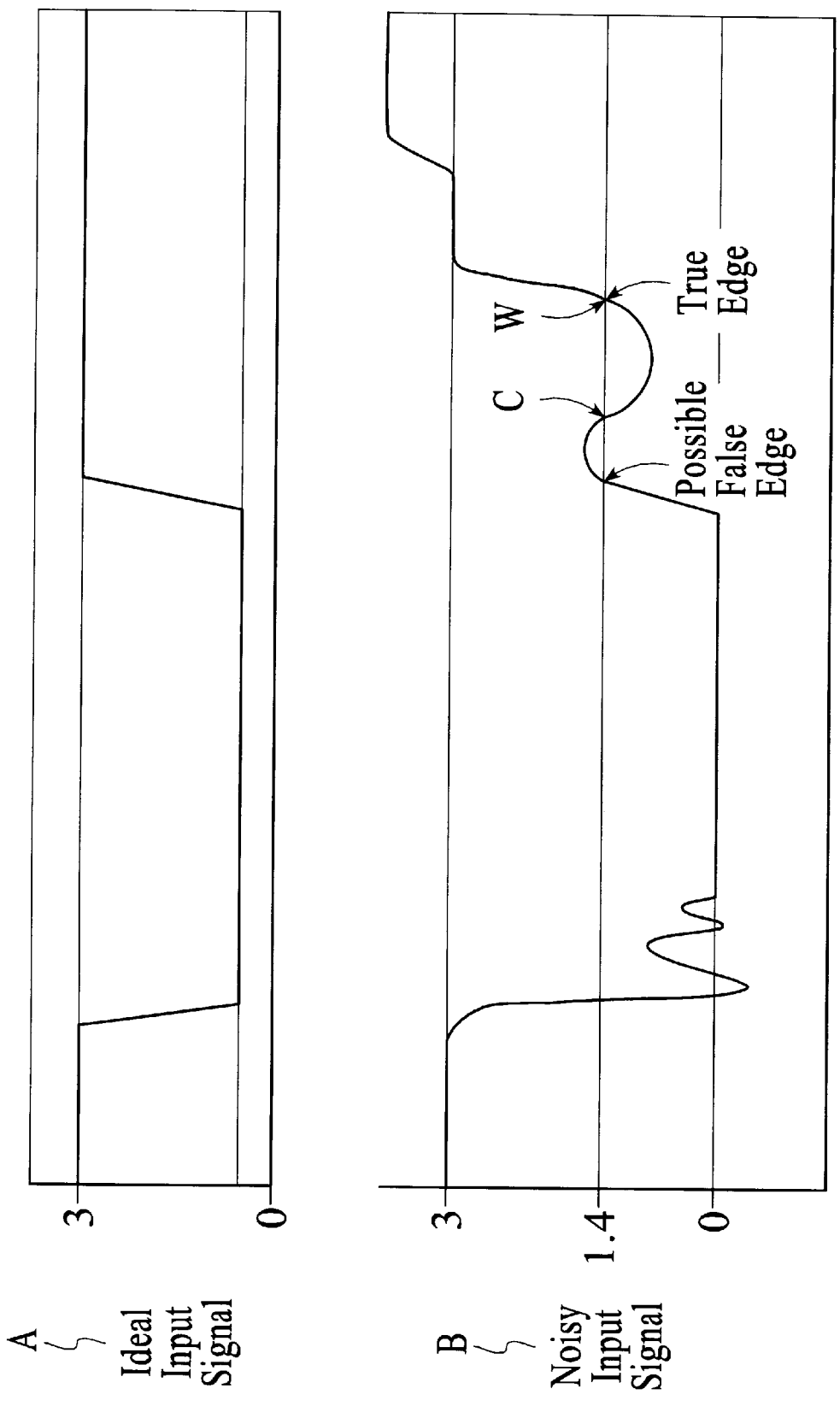
FIG. 1 is a diagram that shows a comparison of an ideal input signal to a noisy input signal.

Referring now to FIG. 1, what is shown is a waveform of an ideal input signal indicated by the designator A which is, as seen for this example, between 0 and 3 volts. Directly below that, indicated by the designator B, is a waveform of a noisy input signal which has the same "true" rising and falling edges. By true edge is meant an edge that is followed by a level that does-not change for a significant amount of time. By "possibly false edge" is meant an edge that is followed by a change in the signal state during a short time. The "possibly false edge" may have been a true edge if transmission line reflections did not occur. As is seen, the noisy input signal has reflections therein shown by C and W which comprise areas that could be detected as false edges. Accordingly, the noisy input signal shown produces a possible false edge rising past the 1.4 volt logic threshold level and a true edge rising past the 1.4 volt threshold. (in this example 1.4 volts is chosen because it is halfway between the TTL load current 0.8 voltage and high at 2.0 volts) For many applications such as Small Computer System Interface (SCSI chips) the rising false edges can cause improper circuit operation because they are followed by falling edges. Hence, it is important to have circuitry that can minimize this type of false edge.

Figure 2:
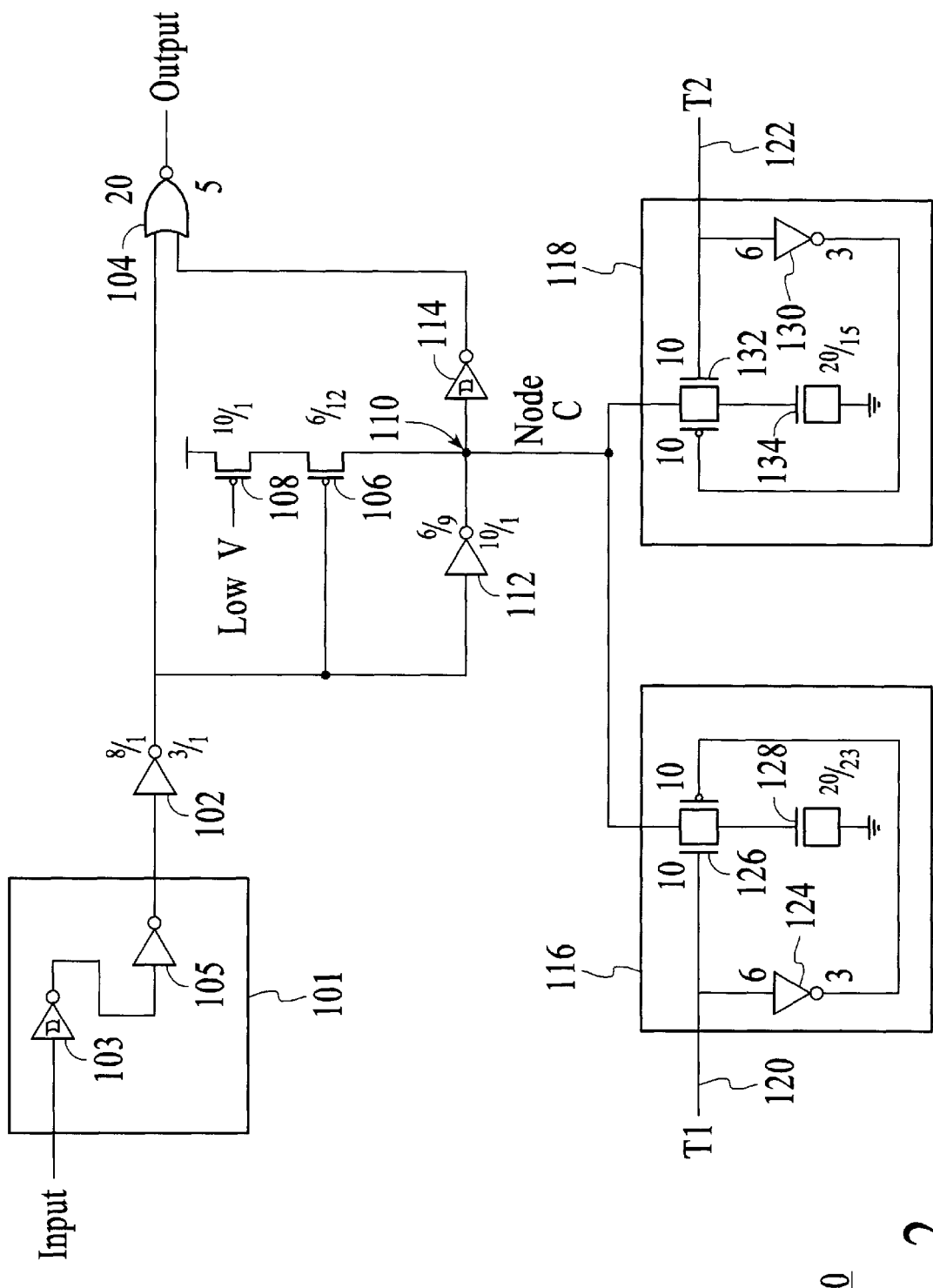
FIG. 2 shows a circuit in accordance with the present invention to remove false edges.

FIG. 2 shows a circuit that provides such a false edge detection and rejection in accordance with the present invention. The circuit 100 comprises an inverter 102 which receives the input signals from the transmission line through a Schmitt Trigger input circuit 101. The input circuit 101 comprises a serially connected Schmitt Trigger 103 and an inverter 105. The output of inverter 102 is connected to a first input of a NOR gate 104. The output of the inverter 102 is also connected to the gate of a transistor 106 whose source is connected in series to the drain of a transistor 108. Finally, the output of the inverter 102 is coupled to the input of inverter 112.

The source of the transistor 108 is connected to Vcc or a high voltage potential. The gate of the transistor 108 receives a low voltage input signal if a 3.3 volt power supply is being used. The drain of transistor 106 is coupled to node 110. The output of inverter 112 is also connected to node 110. Node 110 is also connected to the input of a Schmitt Trigger 114. The output of Schmitt Trigger 114 is connected to a second input of the NOR gate 104.

There are also two control circuits that receive signals 120 and 122 respectively. Signals 120 and 122 are control signals which in conjunction with circuits 116 and 118 control the rise and fall times at node 110. Control circuit 116 includes an inverter 124 and a CMOS switch 126 which receives the control signal 120. The CMOS switch 126 is also coupled to a transistor 128 which operates as a capacitor. The transistor 128 in turn is coupled to ground. The output of the inverter 124 is coupled to the PMOS input of CMOS switch 126.

Control circuit 118 includes an inverter 130 and a CMOS switch 132 which is controlled by signal 122. Switch 132 is also coupled to transistor 134 which operates as a capacitor. The transistor 134 in turn is coupled to ground. The output of the inverter 130 is coupled to the PMOS input of the CMOS switch 132. Control circuits 116 and 118 are identical except that capacitor-transistor 128 is larger than capacitor-transistor 134.

The circuit 100 operates in the following manner. Node 110 slowly rises or quickly falls in response to input signals. There can be four different rise time settings for node 110 depending upon the control signals 120 and 122. If signals 120 and 122 are both low, the capacitor 128 associated with the signal 120 input and the capacitor 134 associated with the signal 122 input are not connected to node 110, hence, node 110 only has the capacitances from the turned off CMOS switches 126 and 132 and other parasitic capacitances to slow its rise time. The signal on node 110 is pulled up by the inverter 124. When only signal 120 is active, then the rise time is slowed by whatever the value is of the combination of the CMOS switch 126 and capacitor 128. When only the signal 122 is active then the rise time of node 110 is affected by the CMOS switch 132 and the capacitor 134. Finally, if both are active, then the combination of the CMOS switches 126 and 132 and the capacitor pair 128 and 134 are used to modify the rise times of the node.

Therefore, in this embodiment, the rise time can be programmable and thereby take into account various delays associated with various size glitches. In addition, this circuit has the feature of providing a power supply voltage level selection through transistor 108. Hence, the gate of transistor 108 upon receiving a low voltage input provides a reduced delay based on adding the additional transistor 106 into the circuit 100. Hence, if a lower voltage is required, for example, 3.3 volts, transistor 108 is enabled, consequently the same delays can be obtained for different power supply voltage levels.

In the present invention the capacitors 128 and 134 are used in conjunction with control signals 120 and 122 to determine the delay in the circuit 100. The capacitors 128 and 134 allow for programmable rejection of glitches of predetermined durations.

It is important that if multiple rising glitches appear at the input to the circuit 100 that all of the glitches are rejected. Hence, it is important that the short glitches not add up to produce a long edge that may be detected as a true edge. To more fully understand how this problem is solved by the present invention, refer now to FIG. 3 which depicts waveforms for the input signal, the signal at node 110 and the output signal of circuit 100. The input waveform shown has several false rising and false falling edges as indicated by D, E, F, G and H. These may be produced by ground bounce. There is only one valid rising edge and one valid falling edge noted by designators 107 and 109 respectively.

Figure 3:
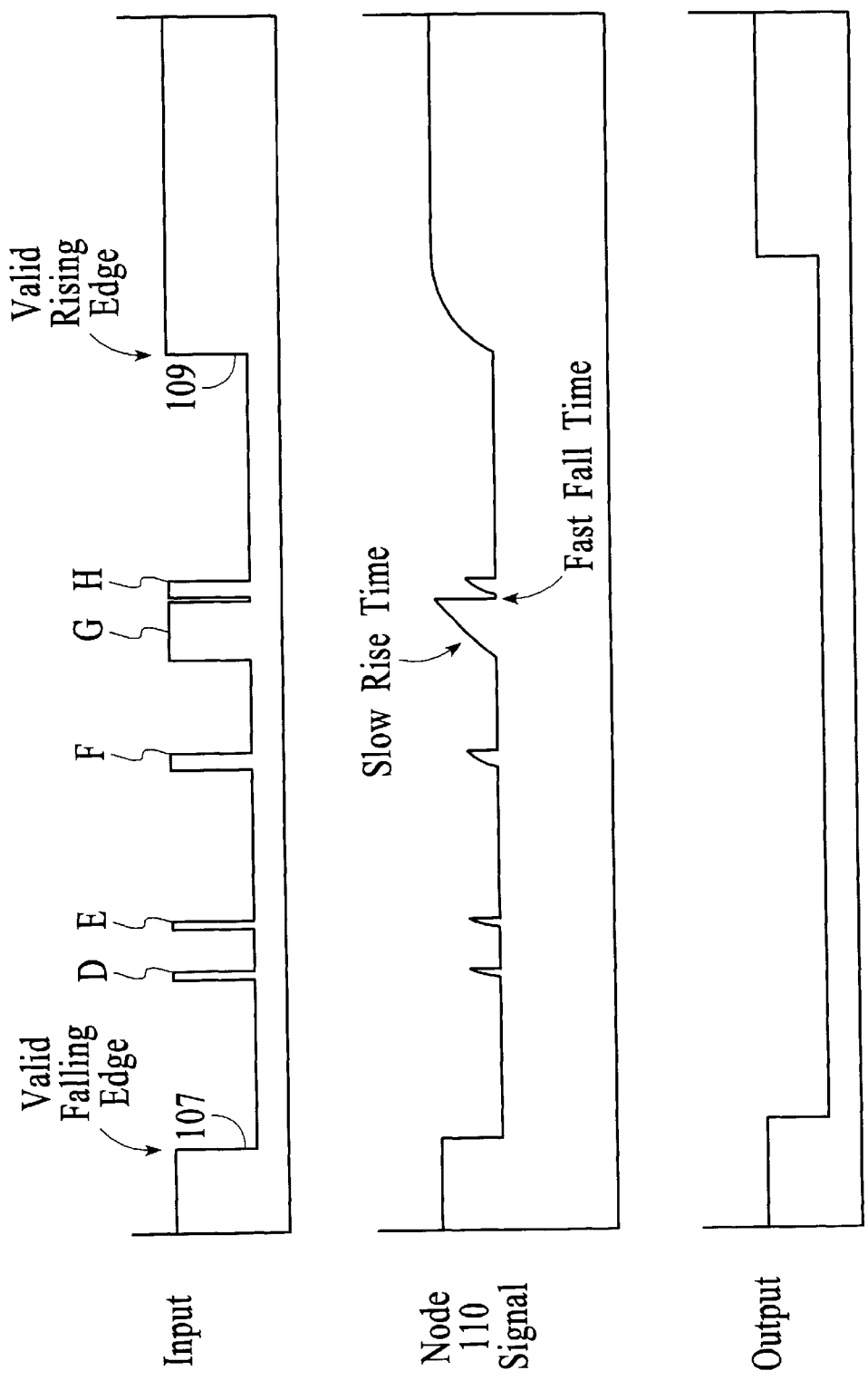
FIG. 3 shows waveforms of an input signal, a signal at a node and an output signal of the circuit of FIG. 2, in accordance with the present invention.

Through the operation of the inverter 112 (FIG. 2) which is in this embodiment, a ratio of 6 to 9 CMOS pullup transistor and a ratio of 10 to 1 NMOS pulldown transistor, the rising edges take a long time to charge the capacitors 128 and 134 and the falling edges would quickly to discharge the capacitors 128 and 134. Therefore the signals on node 110 would be as shown in FIG. 3. Notice that the output signal, shown in FIG. 3, would not have any glitches and that a valid rising edge is passed after a significant delay and a valid falling edge is passed after a short delay. It is important that falling edges are passed quickly through the waveshaper because for the SCSI REQB and ACKB signals it is the falling edges that determine when the data is latched. That is, the data setup time is measured before the falling edge and the data hold time is measured after the falling edge. If the inverter 112 that drives node 110 had been designed for equal rise and fall times, then several short high glitches would add up to charge the capacitor as high as a valid rising edge.

Since the circuit 100 provides slow rise times and fast fall times the capacitors 128 and 134 within control circuits 116 and 118 are reinitialized to 0 volts every time a glitch is finished so the circuit treats every glitch the same. During the 5 volt operation the capacitor sizes give appropriate delays with the pullup portion of the inverter 112 driving node 110.

To adjust for operation in the 3 to 3.6 volt range, two P-channel transistors 106 and 108 are added. Therefore, these two P-channel transistors 106 and 108 would pull up on the node more quickly than would be the case if they were not conducting. Accordingly, essentially there is a switched resistor added into the design to allow node 110 to more quickly get to the proper voltage. The circuit 100 of the present invention delays the response to false rising edges. The present invention removes these false edges by stopping short high pulses from being interpreted as valid high logic levels.

In the past, the fast rise and slow fall times have been implemented by switching in a plurality of resistors and diodes to produce asymmetric rise and fall times. The present invention uses the inverter 112 for this function. This has the advantage over the above mentioned arrangement because unlike that arrangement there is no voltage drop, hence the output signal of the original circuit is not affected.

Finally, the above-mentioned circuit utilizes a Schmitt Trigger circuit 114. Circuit 114 is relatively immune to noise on node 110 from VDD or ground. The hysteresis associated with the circuit 114 will reject much of the noise, such as ground bounce, VDD ripple, capacitive coupling and the like.

Although the present invention has been described in accordance with the embodiments shown in the figures, one of ordinary skill in the art recognizes there could be variations to the embodiments and those variations would be within the spirit and scope of the present invention. Accordingly, many modifications may be made by one of ordinary skills in the art without departing from the spirit and scope of present invention, the scope of which is defined solely by the appended claims.

What is claimed is:

1. An apparatus for removing glitches, including multiple, successive glitches, from an input signal comprising:

means for receiving the input signal;

inverter means connected to the receiving means and to a control node for slowly charging first and second capacitive circuits coupled to the control node in response to a rising edge of the glitches and for quickly discharging the first and second capacitive circuits in response to a falling edge of the glitches, the first capacitive circuit receiving a first control signal and the second capacitive circuit receiving a second control signal, the first and second control signals providing four rise times at the control node, wherein a capacitor of the first capacitive circuit is larger in size than a capacitor of the second capacitive circuit, the inverter means providing a delayed output response at the control node in response to the rising edge of the glitches; and means coupled to the control node and to the inverter means for adjusting the delayed output response to a particular input voltage to remove the glitches.

2. The apparatus as recited in claim 1 wherein the delayed output response at the control node is programmable by the first and second control signals received by the first and second capacitive circuits.

3. The apparatus as recited in claim 2 wherein the inverter means coupled to the receiving means has a pull-up transistor having a ratio of 6 to 9 and a pull-down transistor having a ratio of 10 to 1.

4. The apparatus as recited in claim 3 further comprises a first Schmitt trigger circuit coupled to the control node.

5. The apparatus as recited in claim 4 wherein the adjusting means comprises two series-connected p-channel transistors.

6. The apparatus as recited in claim 4 wherein the first and second capacitive circuits each comprise a CMOS switch coupled to the control node and one of the first and second control signals, the capacitor coupled to the CMOS switch and to ground, and an inverter coupled to the CMOS switch and to the one of the first and second control signals.

7. An apparatus for removing glitches from an input signal comprising:

means for receiving the input signal, the means for receiving the input signal comprising a first Schmitt trigger circuit;

inverter means connected to the receiving means, the inverter means including a pull-up transistor having a ratio of 6 to 9 and a pull-down transistor having a ratio of 10 to 1, and connected to a control node for slowly charging first and second capacitive circuits coupled to the control node in response to a rising edge of the glitches and for quickly discharging the first and second capacitive circuits in response to a falling edge of the glitches, the first capacitive circuit receiving a first control signal and the second capacitive circuit receiving a second control signal, the first and second control signals providing four rise times at the control node, wherein a capacitor of the first capacitive circuit is larger in size than a capacitor of the second capacitive circuit, the inverter means providing a delayed output response at the control node in response to the rising edge of the glitches, wherein the delayed output response at the control node is programmable by the first and second control signals received by the first and second capacitive circuits;

means comprising two series connected p-channel transistors coupled to the control node and to the inverter means for adjusting the delayed output response to a particular input voltage to remove the glitches; and a second Schmitt trigger circuit coupled to the control node.

8. An apparatus for removing glitches, including multiple, successive glitches, from an input signal comprising:

means for receiving the input signal;

first and second capacitive circuits coupled to a control node for providing a delayed output response to the glitches in the input signal, the delayed output response programmably adjusted by an input of first and second control signals, and further wherein the first and second capacitive circuits each comprise a CMOS switch coupled to the control node and one of the first and second control signals, a capacitor coupled to the CMOS switch and to ground, wherein the capacitor of the first capacitive circuit is larger in size than the capacitor of the second capacitive circuit, and an inverter coupled to the CMOS switch and one of the first and second control signals;

inverter means coupled to the receiving means and to the control node for slowly charging the first and second capacitive circuits in response to a rising edge of the glitches, and for quickly discharging the first and second capacitive circuits in response to a falling edge of the glitches; and means comprising series-connected transistors and coupled to the control node and to the first and second capacitive circuits for adjusting the delayed output response to a particular input voltage to effectively remove the glitches.

* * * * *